(12) United States Patent  
Ramanathan et al.

(10) Patent No.: US 7,034,394 B2  
(45) Date of Patent: Apr. 25, 2006

(54) MICROELECTRONIC ASSEMBLY HAVING THERMOELECTRIC ELEMENTS TO COOL A DIE AND A METHOD OF MAKING THE SAME

(75) Inventors: Shriram Ramanathan, Hillsboro, OR (US); Sarah E. Kim, Portland, OR (US); R. Scott List, Beaverton, OR (US); Gregory M. Chrysler, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/682,137

(22) Filed: Oct. 8, 2003

(65) Prior Publication Data

US 2005/0077619 A1 Apr. 14, 2005

(51) Int. Cl.  
*H01L 23/34* (2006.01)

(52) U.S. Cl. ........................ 257/712; 257/720
(58) Field of Classification Search ........ 257/712–722; 361/717  
See application file for complete search history.

(56) References Cited

U.S. PATENT DOCUMENTS

| | | | |
|---|---|---|---|
| 6,230,497 B1* | 5/2001 | Morris et al. | 62/3.7 |
| 6,614,109 B1* | 9/2003 | Cordes et al. | 257/712 |
| 2002/0024154 A1 | 2/2002 | Hara et al. | |
| 2002/0113289 A1 | 8/2002 | Cordes et al. | |
| 2003/0122245 A1 | 7/2003 | Chu et al. | |

\* cited by examiner

*Primary Examiner*—Roy Karl Potter  
(74) *Attorney, Agent, or Firm*—Blakely, Sokoloff, Taylor & Zafman LLP

(57) ABSTRACT

A microelectronic assembly is provided, having thermoelectric elements formed on a die so as to pump heat away from the die when current flows through the thermoelectric elements. In one embodiment, the thermoelectric elements are integrated between conductive interconnection elements on an active side of the die. In another embodiment, the thermoelectric elements are on a backside of the die and electrically connected to a carrier substrate on a front side of the die. In a further embodiment, the thermoelectric elements are formed on a secondary substrate and transferred to the die.

27 Claims, 8 Drawing Sheets

MICROELECTRONIC ASSEMBLY HAVING THERMOELECTRIC ELEMENTS TO COOL A DIE AND A METHOD OF MAKING THE SAME

BACKGROUND OF THE INVENTION

1). Field of the Invention

This invention relates generally to a microelectronic assembly having a microelectronic die, and more specifically to systems that are used to cool a microelectronic die of such an assembly.

2). Discussion of Related Art

As semiconductor devices, such as processors and processing elements, operate at continually higher data rates and higher frequencies, they generally consume greater current and produce more heat. It is desirable to maintain operation of these devices within certain temperature ranges for reliability reasons, among others. Conventional heat transfer mechanisms have restricted the operation of such devices to lower power levels, lower data rates, and/or lower operating frequencies. Conventional heat transfer mechanisms have limited heat transfer capability due to size and location restrictions, as well as thermal limitations.

BRIEF DESCRIPTION OF THE DRAWINGS

The invention is described by way of example(s) with reference to the accompanying drawings, wherein.

DETAILED DESCRIPTION OF THE INVENTION

A microelectronic assembly is provided, having thermoelectric elements formed on a die so as to pump heat away from the die when current flows through the thermoelectric elements. In one embodiment, the thermoelectric elements are integrated between conductive interconnection elements on an active side of the die. In another embodiment, the thermoelectric elements are on a backside of the die and electrically connected to a carrier substrate on a front side of the die. In a further embodiment, the thermoelectric elements are formed on a secondary substrate and transferred to the die.

Figure 1:
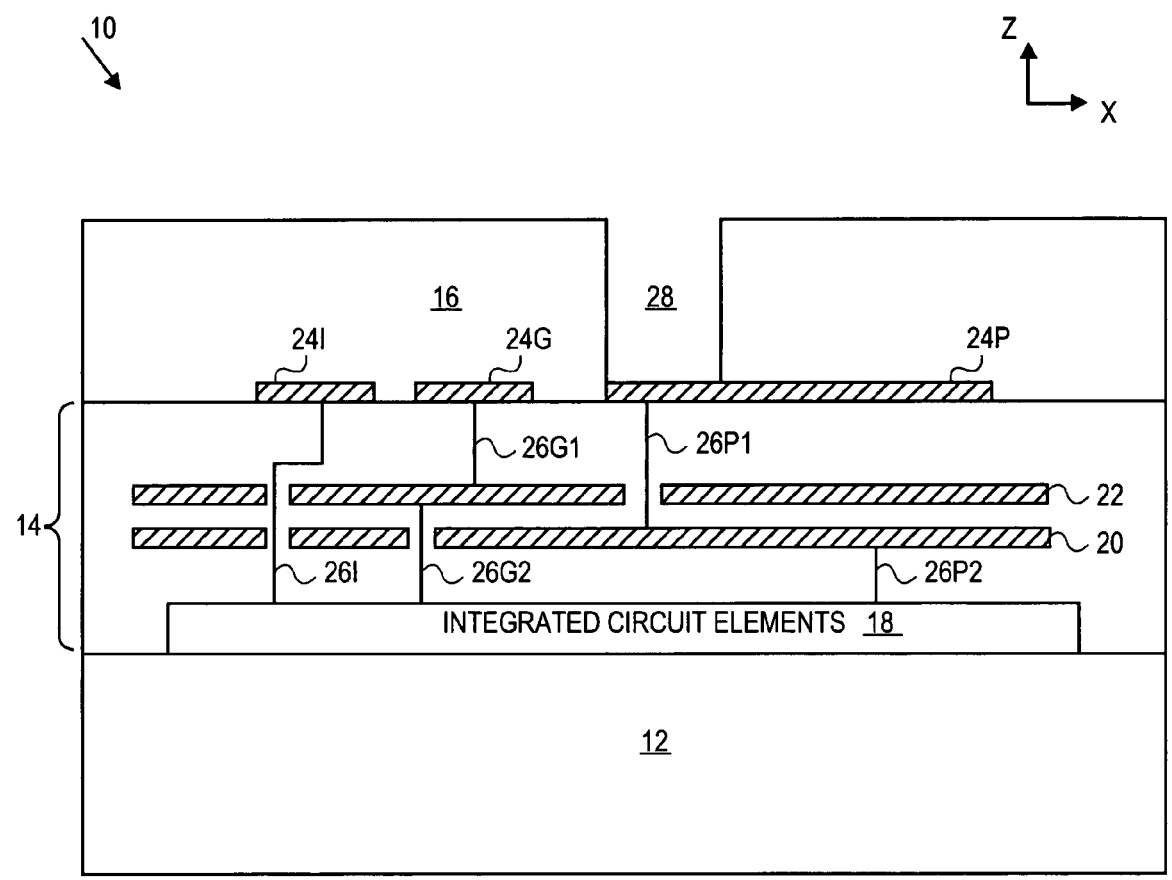
FIG. 1 is a cross-sectional side view of a portion of a wafer substrate which is partially processed to manufacture a microelectronic assembly, according to an embodiment of the invention.

FIG. 1 of the accompanying drawings illustrates a portion of wafer 10 which is partially processed to manufacture a microelectronic assembly, according to an embodiment of the invention. The wafer 10 includes a wafer substrate 12, an integrated circuit 14, and a dielectric material 16.

The wafer substrate 10 is typically made of silicon or another semiconductor material. The integrated circuit 14 includes integrated circuit elements 18 that are formed in and on the wafer substrate 12. The integrated circuit elements 18 include transistors, capacitors, diodes, etc. The integrated circuit 14 further includes a plurality of alternating dielectric layers and metal layers. The metal layers include a power plane 20 and a ground plane 22. The integrated circuit 14 further includes contact pads 24, including a power contact 24P, a ground contact 24G, and a signal contact 24I.

Further, plugs, vias, and metal lines in the dielectric layers of the integrated circuit 14 form electric links 26, only a few of the electric links 26 being shown.

The electric links 26 include a power electric link 26P1 interconnecting the power contact pad 24P with the power plane 20, and a power electric link 26P2 interconnecting the power plane 20 with the integrated circuit elements 18. As such, power can be provided through the power contact pad 24P, the power electric link 26P1, the power plane 20, and the power electric link 26P2 to one or more of the integrated circuit elements 18.

The electric links 26 include a ground electric link 26G1 interconnecting the ground contact pad 24G with the ground plane 22, and a ground electric link 26G2 interconnecting the ground plane 22 with the integrated circuit elements 18. As such, ground can be provided through the ground contact pad 24G, the ground electric link 26G1, the ground plane 22, and the ground electric link 26G2 to one or more of the integrated circuit elements 18.

A signal electric link 26I interconnects a signal contact pad 24I with one or more of the integrated circuit elements 18, and is disconnected from both the power plane 20 and the ground plane 22. Signals can be provided to and from the integrated circuit elements 18 through more signal electric links such as the signal electric link 26I.

The dielectric material 16 is formed in a layer over the integrated circuit 14. The dielectric material 16 initially covers the contact pads 24. A first opening 28 is then etched in the dielectric material 16, which exposes an area of the power contact pad 24P.

Figure 2:
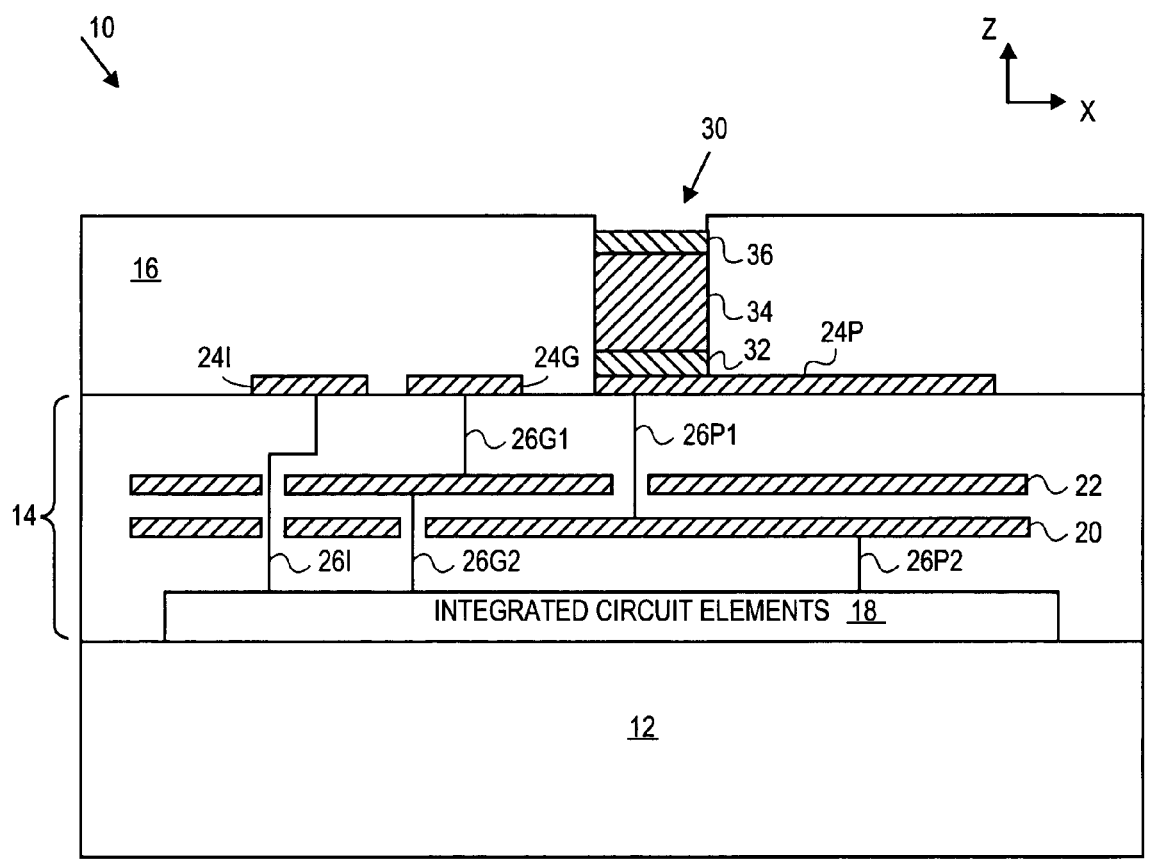
FIG. 2 is a view similar to FIG. 1, after an opening is etched in a dielectric layer of the partially processed wafer substrate and one thermoelectric element is formed in the opening.

As illustrated in FIG. 2, an thermoelectric element 30 is subsequently formed in the opening 28 of FIG. 1. Layers of the thermoelectric element 30 may be electrolessly plated or sputtered, and include a diffusion barrier layer 32, a p-doped semiconductor material 34 such as p-doped $Bi_2Te_3$, alloys of $Bi_2Te_3$ and $Sb_2Te_3$, or alloys of Si and Ge, and a diffusion barrier layer 36, formed sequentially on top of one another.

Figure 3:
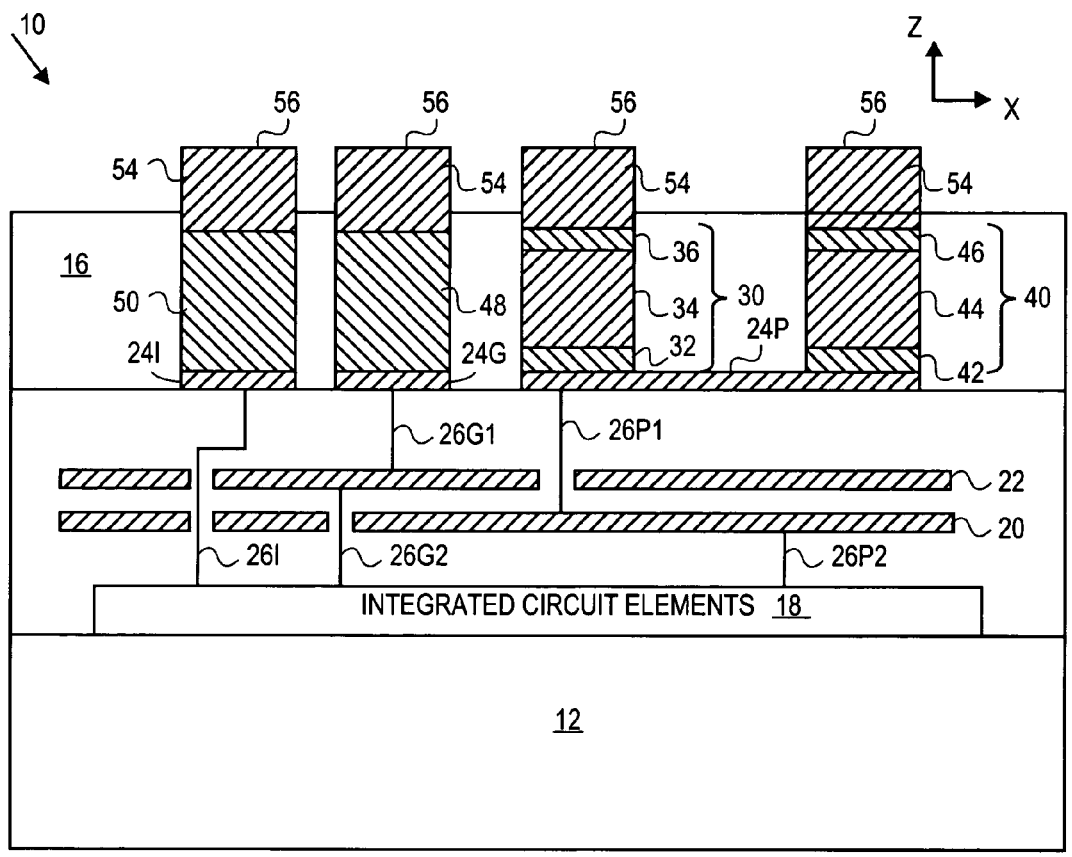
FIG. 3 is a view similar to FIG. 1, after another thermoelectric element, having an opposite doping conductivity type and the thermoelectric element that is formed in FIG. 2, is formed, as well as other components above an integrated circuit of the partially processed wafer.

As illustrated in FIG. 3, another thermoelectric element 40 is formed adjacent to the thermoelectric element 30 on the power contact pad 24P. The thermoelectric element 40 is formed in an opening that is formed in the dielectric material 16 after the thermoelectric element 30 is formed. In order to form the opening for the thermoelectric element 40, a photoresist layer is formed over the dielectric material 16, and an opening is masked in the photoresist layer above where the thermoelectric element 40 is to be formed. Using the photoresist layer as a mask, the opening where the thermoelectric element 40 is to be formed is then etched in the dielectric material 16. The thermoelectric element 40 includes a diffusion barrier layer 42, an n-doped semiconductor material 44 such as n-doped $Sb_2Te_3$, alloys of $Bi_2Te_3$ and $Sb_2Te_3$, or alloys of Si and Ge, and a diffusion barrier layer 46 formed sequentially on top of one another. The thermoelectric element 40 is thus the same as the thermoelectric element 30, except that the semiconductor material 34 is p-doped, whereas the semiconductor material 44 is n-doped.

Conductive spacer components 48 and 50 are subsequently formed on the ground and signal contact pads 24G and 24I, respectively. Openings in which the conductive spacer components 48 and 50 are formed may be etched by forming a photoresist layer over the dielectric material 16 and the thermoelectric elements 30 and 40, masking the photoresist layer, and then using openings in the masked photoresist layer to etch the openings where the conductive spacer components 48 and 50 are to be formed in the dielectric material 16. The conductive spacer components 48 and 50 are typically made of a metal.

Conductive interconnection elements 54 are subsequently formed, each on a respective one of the thermoelectric elements 30 or 40, or the conductive spacer components 48 or 50. The conductive interconnection elements 54 stand proud of the dielectric material 16 so as to have upper surfaces 56 that are in a common plane above an upper plane of the dielectric material 16.

Only a portion of the wafer 10 is illustrated in FIGS. 1 to 3. It should, however, be understood that the wafer includes a plurality of the integrated circuits 14 that are formed in rows and columns extending in x- and y-directions across the wafer, each having an identical layout of thermoelectric elements 30 and 40, conductive spacer components 48 and 50, and conductive interconnection elements 54.

The wafer 10 is subsequently diced or singulated into individual dies, each die carrying a respective integrated circuit and related connections. Each die will include components represented in the portion of the wafer 10 illustrated in FIG. 3.

Figure 4:
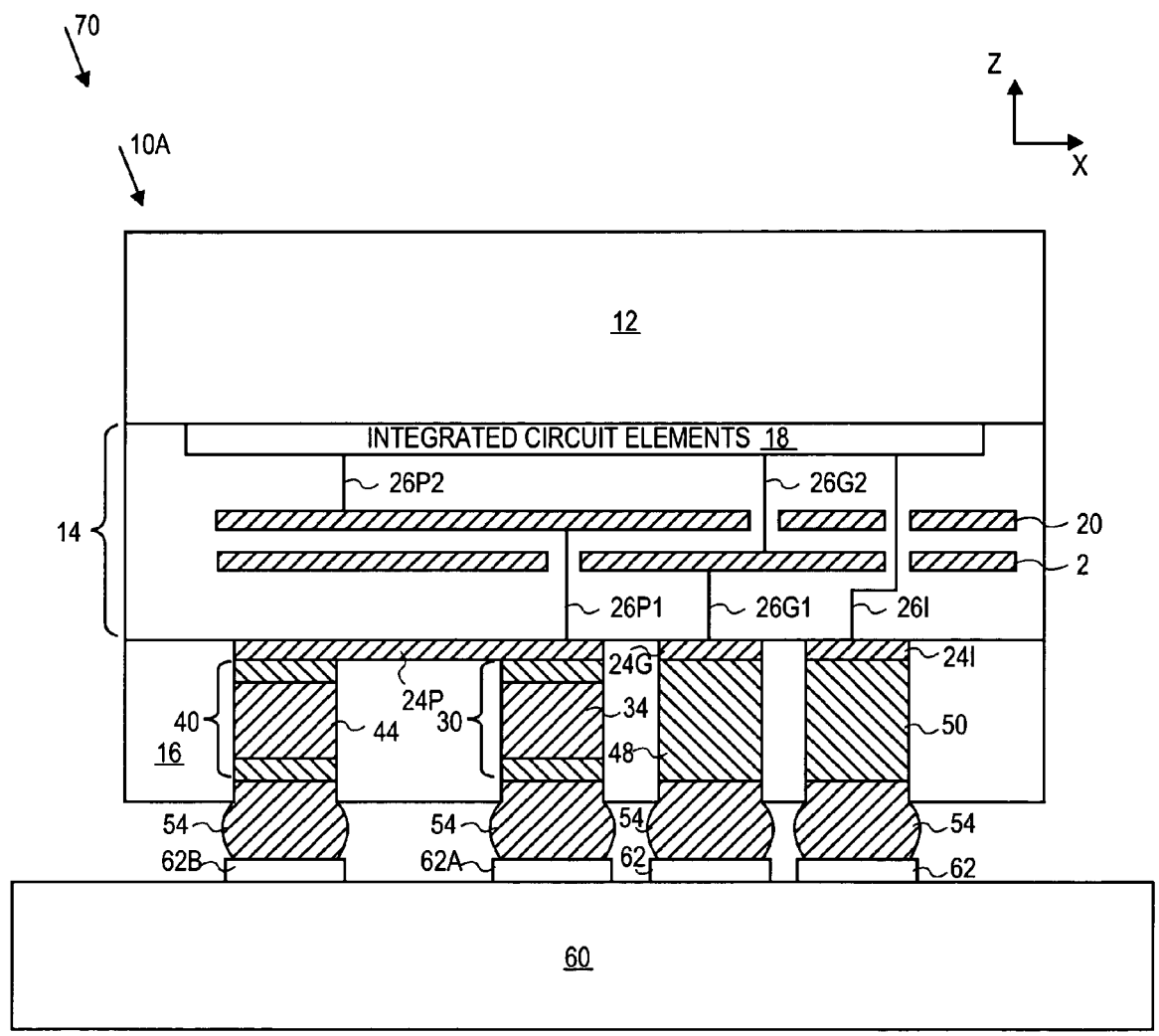
FIG. 4 is a view similar to FIG. 3, after the wafer is finally processed, singulated into individual dies, and one die is flipped onto a carrier substrate and mounted to the carrier substrate to finalize the manufacture of a microelectronic assembly according to an embodiment of the invention.

FIG. 4 illustrates one such die 10A, which is flipped and located on a carrier substrate in the form of a package substrate 60. Package terminals 62 are formed on an upper surface of the package substrate 60. Each one of the conductive interconnection elements 54 is in contact with a respective package terminal 62.

The entire microelectronic assembly 64, including the die 10A and the package substrate 60, is then inserted in a furnace to reflow the conductive interconnection elements 54. The conductive interconnection elements 54 soften and melt, and are subsequently allowed to cool and again solidify. Each conductive interconnection element 54 is then attached to a respective package terminal 62, thereby mounting the die 10A to the package substrate 60 and electrically interconnecting the die 10A and the package substrate 60.

In use, power can be provided through the package substrate 60 through one of the package terminals 62A to the thermoelectric element 30. The current flows toward the die through the p-doped semiconductor material 34. As will be understood in the art of thermoelectrics, current flowing through a p-doped semiconductor material causes heat to be pumped in a direction opposite to the direction that the current flows. As such, heat is pumped in a direction away from the integrated circuit 14 through the thermoelectric element 30 toward the package substrate 60. The current flowing through the thermoelectric element 30 is bifurcated. One portion of the current provides power to some of the integrated circuit elements 18, while some of the current flows through the power contact pad 24P and then through the thermoelectric element 40 to the package terminal 62B. The current flowing through the n-doped semiconductor material 44 causes heat to be pumped in a direction that the current flows. The current flowing through the n-doped semiconductor material 44 flows away from the integrated circuit 14, and thus pumps heat away from the integrated circuit 14.

In another embodiment, the power contact pads providing power to the thermoelectric elements may be separate from power contact pads providing power to the circuit. This will allow separate control over the thermoelectric unit. Such a configuration may be useful where it is necessary to maintain voltage provided to the circuit and not have the voltage be affected by power provided to the thermoelectric module.

It can thus be seen that the p-doped semiconductor material 34 and n-doped semiconductor material 44 both pump heat away from the integrated circuit 14. Localized cooling can thus be provided to the integrated circuit 14. More structures, such as the structure including the thermoelectric elements 30 and 40 may be formed at desired locations across the integrated circuit 14, where additional cooling may be required. What should also be noted is that the same array of package terminals 62 that provide current to the thermoelectric elements 30 and 40 also provide power, ground, and signal to the integrated circuit 14. What should further be noted is that cooling is provided where it is required. When a certain region in an x-y direction of an integrated circuit requires power, the power is provided through thermoelectric elements in the same region. An increase in power requirements in a particular area will correspond with an increase in heat being generated in that particular area. An increase in power in the particular area will also correspond with an increase in current flowing through thermoelectric elements in that particular area. As such, current flowing through thermoelectric elements in a particular area will increase when there is an increase of heat being generated in the particular area.

Figure 5:
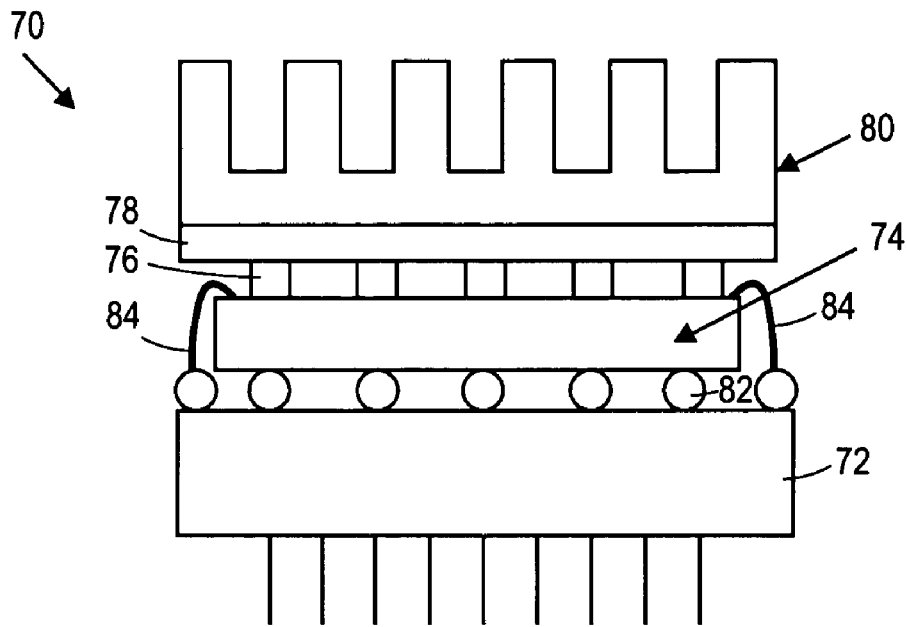
FIG. 5 is a side view representing a microelectronic assembly according to another embodiment of the invention having thermoelectric components on a side opposing an active side of a singulated die, and wirebonded to a package substrate on an active side of the die.

FIG. 5 illustrates another microelectronic assembly 70, including a carrier substrate in the form of a package substrate 72, a die 74 mounted to the package substrate 72, thermoelectric elements 76 on the die 74, an integrated heat spreader 78, and a heat sink 80. The die 74 is mounted and electrically connected through conductive interconnection elements 82 to the package substrate 72.

The thermoelectric elements 76 are formed in the same manner as the thermoelectric elements 30 and 40 of FIG. 3. Some of the thermoelectric elements 76 have p-doped semiconductor materials, and some have n-doped semiconductor material. The thermoelectric elements 76 are arranged such that, when current flows therethrough, heat is pumped from an upper surface of the die 76 toward the integrated heat spreader 78.

The integrated heat spreader 78 is in direct contact with the thermoelectric elements 76, and the heat sink 80 is located on the integrated heat spreader 76. As will be commonly understood, the heat sink 80 includes a base and plurality of fins extending from the base, from which the heat can be convected to surrounding atmosphere.

Wirebonding wires 84 are provided, through which current can be provided to or be conducted away from the thermoelectric elements 76. Each wirebonding wire 84 has one end connected to a pad on an upper surface of the die 74, the pad being connected to a first of the thermoelectric elements 76. An opposing end of the respective wirebonding wire 84 is bonded to a package terminal on the package substrate 72. The current flows from the package terminal through the respective wirebonding wire 84 and the respective contact through the first thermoelectric element 76. The current can then flow through an even number of the thermoelectric elements 76 and return through another one of the wirebonding wires 84 to the package substrate 72.

Figure 6:
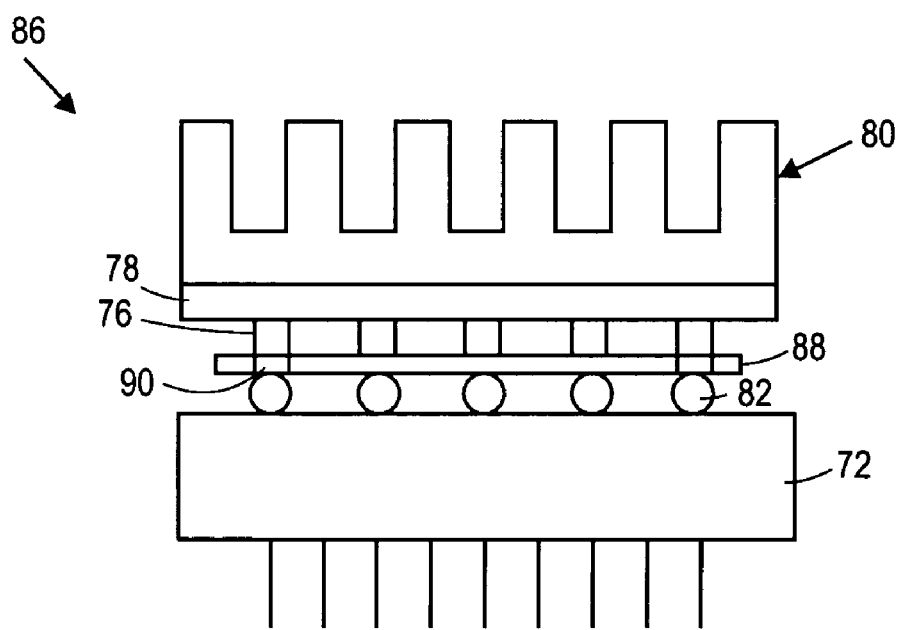
FIG. 6 is a side view representing a microelectronic assembly according to a further embodiment of the invention, which defers from the embodiment of FIG. 5 in that short plugs electrically connect thermoelectric elements on one side of the die with conductive interconnection elements formed on an opposing, active side of the die.

FIG. 6 illustrates a microelectronic assembly 86 according to a further embodiment of the invention. The microelectronic assembly 86 is the same as the microelectronic assembly 70 of FIG. 5, and like reference numerals indicate like components. The primary difference is that the microelectronic assembly 86 includes a die 88 which is much thinner than the die 74 of FIG. 5. Short plugs 90 are formed through the die 88. Some of the thermoelectric elements 76 are aligned with respective ones of the plugs 90 and respective ones of the conductive interconnection elements 82. Current can be provided through a respective conductive interconnection element 82 and a respective plug 90 to a respective thermoelectric element 76. The current can then flow through an even number of the thermoelectric elements 76 and return through another one of the plugs 90 and another one of the conductive interconnection elements 82 aligned with one another.

Figure 7:
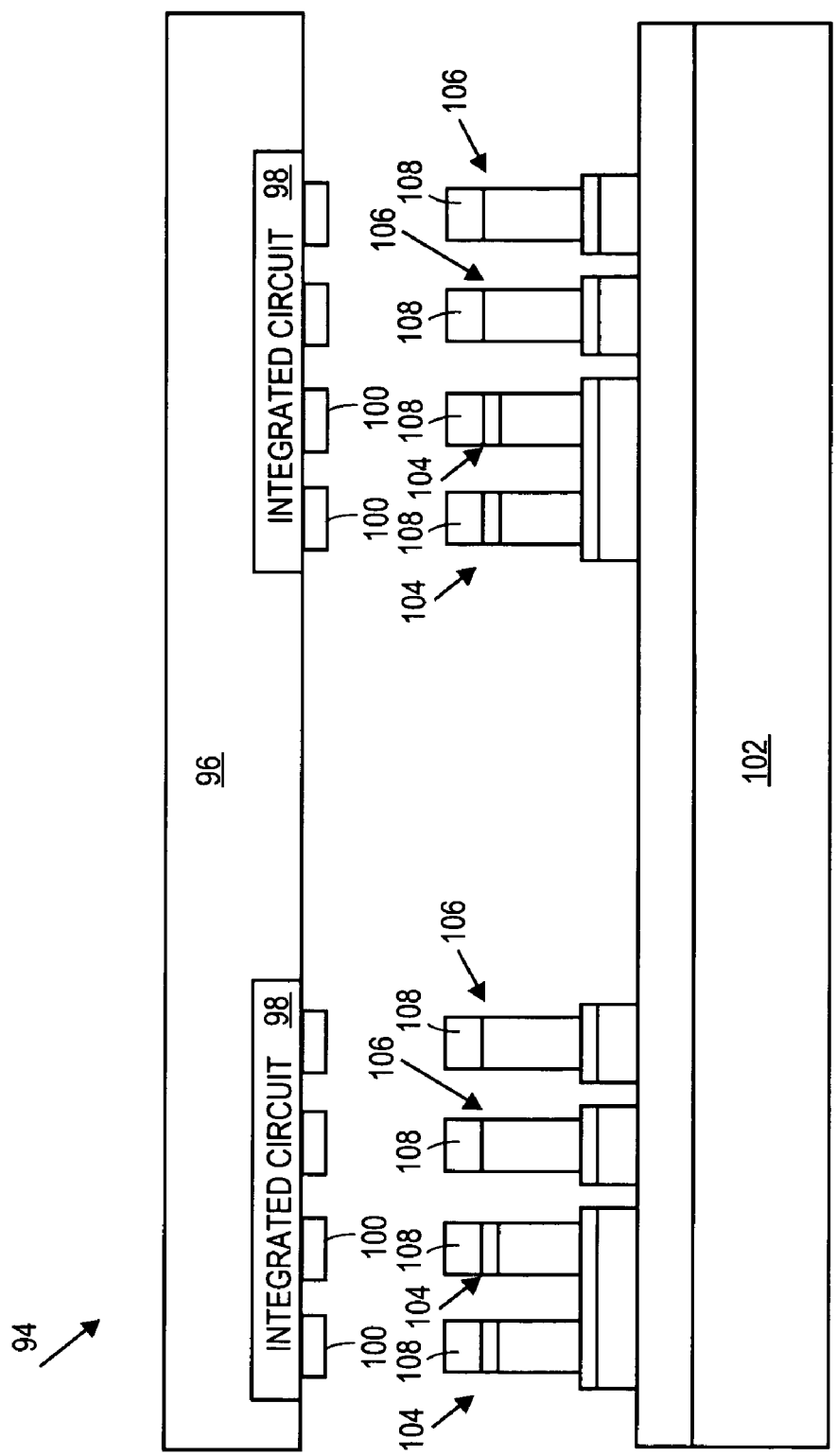
FIG. 7 is a side view of two wafer substrates, one carrying active integrated circuits, and the other one carrying thermoelectric elements, used to manufacture a microelectronic assembly according to a further embodiment of the invention.
Figure 8:
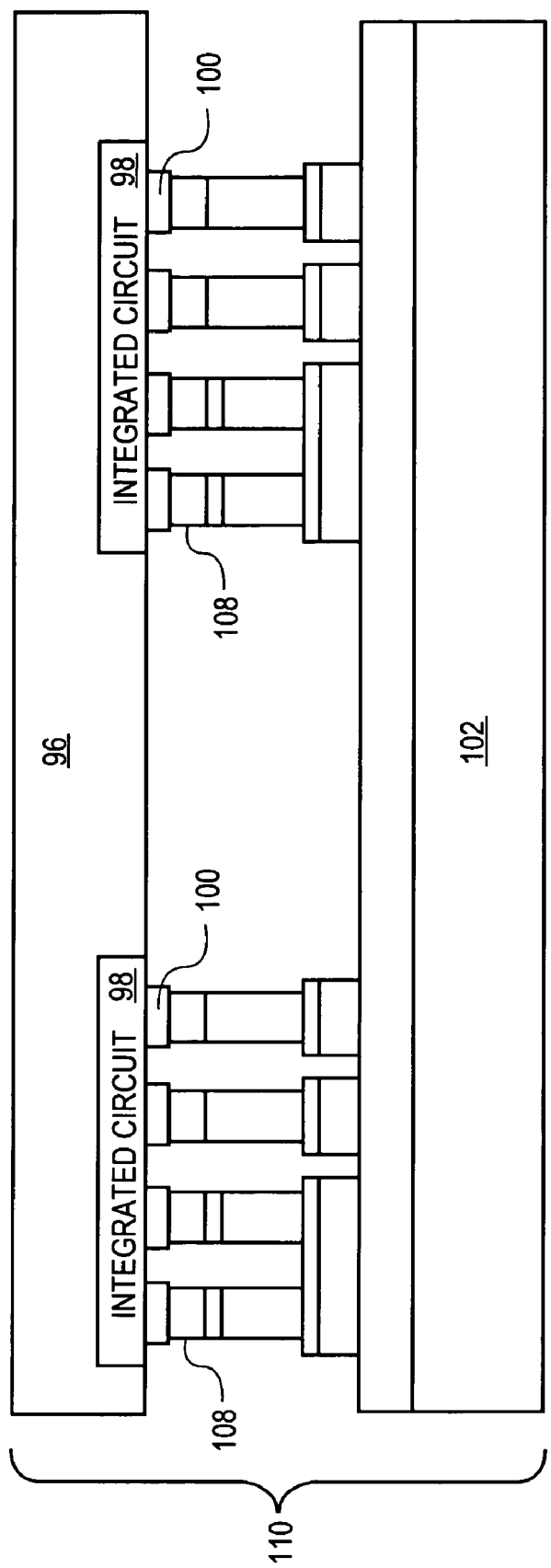
FIG. 8 is a view similar to FIG. 7, after the thermoelectric elements are located against and attached to contact pads on the integrated circuit.

FIGS. 7 through 8 illustrate the manufacture of a microelectronic assembly, wherein thermoelectric elements are manufactured on a separate substrate and then transferred to integrated circuits at wafer level. The combination wafer is then singulated into individual pieces.

Referring specifically to FIG. 7, a wafer 94 is provided, having a wafer substrate 96, integrated circuits 98 formed on the wafer substrate 96, and contact pads 100 formed on the integrated circuits 98. FIG. 7 also illustrates a transfer substrate 102 having thermoelectric elements 104 formed thereon in a manner similar to the thermoelectric elements 30 and 40 of FIG. 3. FIG. 7 also illustrates interconnection structures in the form of spacers 106. The thermoelectric elements 104 and spacers 106 have conductive interconnection elements 108 formed thereon.

As illustrated in FIG. 7, each conductive interconnection element 108 is brought into contact with a respective one of the contact pads 100. The conductive interconnection elements 108 are then attached to the contact pads 100 by a thermal reflow process. A combination wafer 110 is provided that includes the wafer substrates 96 and 102.

Figure 9:
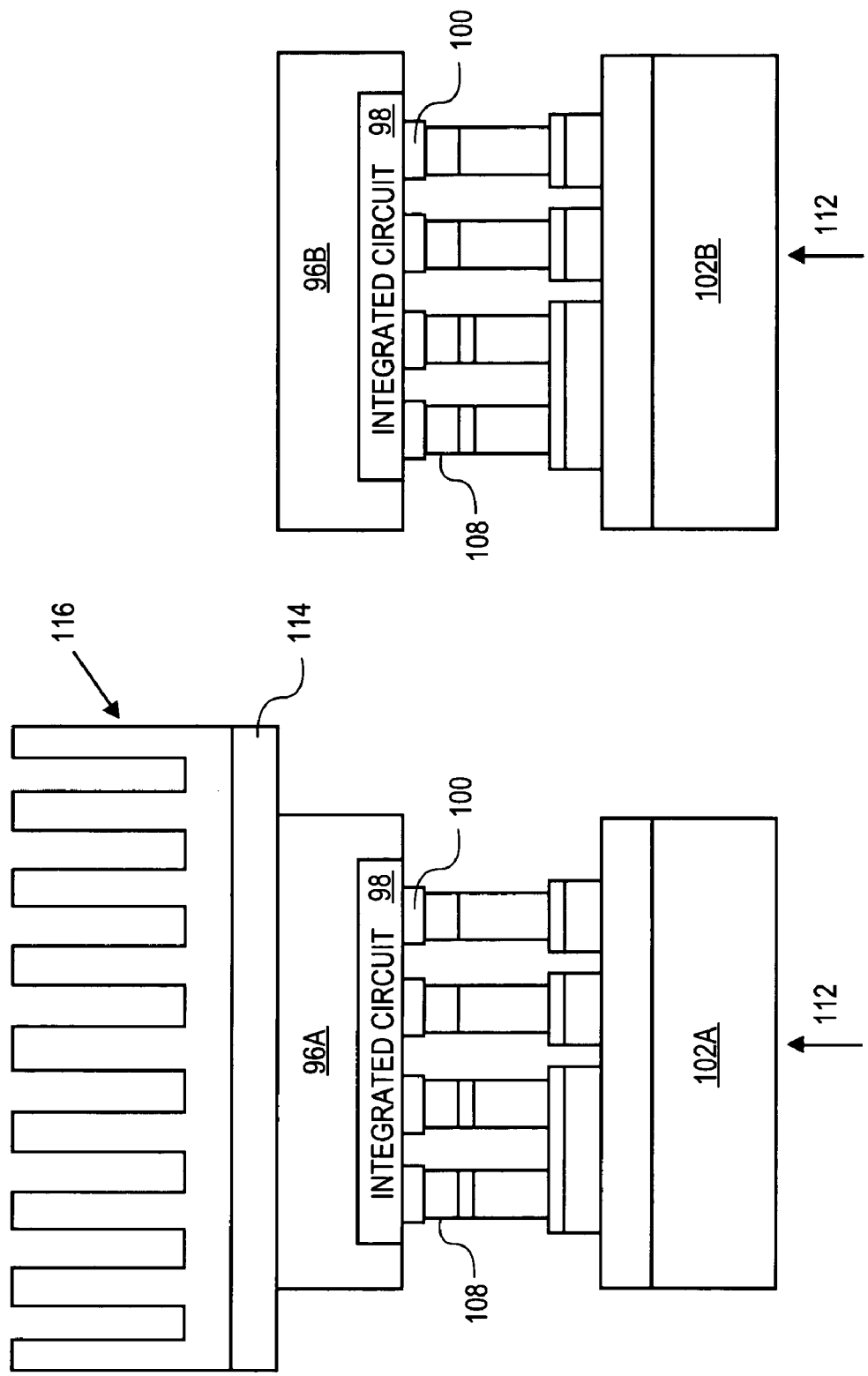
FIG. 9 is a view similar to FIG. 8, after the assembly of FIG. 8 is singulated into individual pieces, and an integrated circuit and a heat sink are mounted to one of the pieces.

Reference is now made to FIG. 9. The combination wafer 110 of FIG. 8 is singulated into separate pieces 112. The wafer 96 is thus separated into pieces 96A and 96B, and the wafer 102 is separated into pieces 102A and 102B. The pieces 112 are identical, and each includes a respective integrated circuit 98. Metallization is provided in an upper level of the pieces 102A and 102B. the pieces may be mounted on supporting substrates and wirebonded to the supporting substrates. Alternatively, the pieces 102A and 102B may be thinned down and through-vias in the pieces 102A and 102B may connect the metallization electrically to the supporting substrates.

An integrated heat spreader 114 can then be mounted to a backside of the wafer substrate portion of a piece 96A, i.e., opposing the integrated circuit 98, and a heat sink 116 can be located and mounted against the integrated heat spreader 114.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A microelectronic assembly, comprising:
a die substrate;
an integrated circuit formed on the die substrate, the die substrate and integrated circuit jointly forming a die; and
a plurality of thermoelectric elements formed on a side of the die, with the integrated circuit between the die substrate and the thermoelectric elements so as to pump heat away from the die when current flows through the thermoelectric elements.

2. The microelectronic assembly of claim 1, wherein the integrated circuit includes a power plane connected to the thermoelectric elements, such that power is provided through the thermoelectric elements to the power plane.

3. The microelectronic assembly of claim 2, further comprising a power conductive interconnection element formed on each thermoelectric element.

4. The microelectronic assembly of claim 3, further comprising a plurality of ground and signal conductive interconnection elements having contact surfaces in a plane of contact surfaces of the power conductive interconnection elements.

5. The microelectronic assembly of claim 4, further comprising a carrier substrate and a plurality of carrier substrate lands on the carrier substrate, each conductive interconnection element being located against a respective carrier substrate land.

6. The microelectronic assembly of claim 1, further comprising a dielectric material surrounding the thermoelectric elements.

7. The microelectronic assembly of claim 1, wherein the thermoelectric elements are in pairs, each pair including a respective thermoelectric element that is p-doped and a respective thermoelectric element that is n-doped, further comprising a plurality of link elements formed on the die, each link element interconnecting two thermoelectric elements of a respective pair.

8. The microelectronic assembly of claim 1, wherein the thermoelectric elements are formed on a side of the die, with the integrated circuit between the die substrate and the thermoelectric elements, further comprising a dielectric material surrounding the thermoelectric elements, and wherein the integrated circuit includes a power plane connected to the thermoelectric elements such that power is provided through the thermoelectric elements to the power plane.

9. The microelectronic assembly of claim 7, further comprising a carrier substrate and a plurality of carrier substrate lands on the carrier substrate, each link element being located against a respective carrier substrate land.

10. The microelectronic assembly of claim 1, further comprising a plurality of die lands on the die, a plurality of first diffusion barrier layers, each on a respective die land, each thermoelectric element being formed on a respective diffusion barrier layer.

11. The microelectronic assembly of claim 10, further comprising at least one second diffusion barrier layer on at least one of the thermoelectric elements, with the respective thermoelectric element between a respective one of the first diffusion barrier layers and the second diffusion barrier layer.

12. The microelectronic assembly of claim 10, wherein the thermoelectric elements are formed on a side of the die, with the integrated circuit between the die substrate and the thermoelectric elements.

13. The microelectronic assembly of claim 11, wherein the thermoelectric elements are formed on a side of the die, with the die substrate between the integrated circuit and the thermoelectric elements.

14. The microelectronic assembly of claim 13, further comprising a carrier substrate, the die being mounted to the carrier substrate and the thermoelectric elements being electrically connected to the carrier substrate to receive power from the carrier substrate.

15. The microelectronic assembly of claim 1, further comprising a thermally conductive plate thermally coupled to the thermoelectric elements, with the thermoelectric elements between the die and the thermally conductive plate.

16. The microelectronic assembly of claim 15, further comprising a plurality of fins extending from the thermally conductive plate from which heat, conducting from the thermally conductive plate, convects to surrounding air.

17. A microelectronic assembly, comprising:
   a die substrate;
   an integrated circuit formed on the die substrate, the die substrate and integrated circuit jointly forming a die;
   a plurality of thermoelectric elements formed on the die so as to pump heat away from the die when current flows through the thermoelectric elements; and
   a dielectric material surrounding the thermoelectric elements.

18. The microelectronic assembly of claim 17, wherein the thermoelectric elements are formed on a side of the die, with the die substrate between the integrated circuit and the thermoelectric elements.

19. The microelectronic assembly of claim 18, further comprising a dielectric material surrounding the thermoelectric elements.

20. The microelectronic assembly of claim 18, wherein the thermoelectric elements are in pairs, each pair including a respective thermoelectric element that is p-doped and a respective thermoelectric element that is n-doped, further comprising a plurality of link elements formed on the die, each link element interconnecting two interconnection elements of a respective pair.

21. The microelectronic assembly of claim 18, further comprising a carrier substrate, the die being mounted to the carrier substrate and the thermoelectric elements being electrically connected to the carrier substrate to receive power from the carrier substrate.

22. The microelectronic assembly of claim 21, further comprising a plurality of carrier substrate lands on the carrier substrate, a plurality of thermoelectric lands connected to the thermoelectric elements, and a plurality of wirebonding wires, each having one portion attached to a respective carrier substrate land and another portion attached to a respective thermoelectric land.

23. The microelectronic assembly of claim 22, wherein the thermoelectric lands are formed on the die substrate.

24. The microelectronic assembly of claim 23, further comprising a plurality of conductive interconnection elements attached to the die on a side thereof with the integrated circuit between the conductive interconnection elements and the die substrate, each conductive interconnection element being in contact with a respective one of the carrier substrate lands.

25. The microelectronic assembly of claim 18, further comprising a plurality of conductive interconnection elements attached to the die on a side thereof with the integrated circuit between the conductive interconnection elements and the die substrate, each conductive interconnection element being in contact with a respective one of the carrier substrate lands.

26. The microelectronic assembly of claim 25, further comprising a plurality of thermoelectric vias in the die, a first plurality of the conductive interconnection elements connecting the integrated circuit with a first plurality of the carrier substrate lands and a second plurality of the conductive interconnection elements being connected through the thermoelectric vias to the thermoelectric elements.

27. The microelectronic assembly of claim 26, wherein at least one of the thermoelectric elements is aligned with one of the thermoelectric vias and one of the conductive interconnection elements.

* * * * *